United States Patent [19]

Miura et al.

[11] Patent Number: 5,060,200
[45] Date of Patent: Oct. 22, 1991

[54] PARTIAL RANDOM ACCESS MEMORY

[75] Inventors: Daisuke Miura, Yokohama; Junichi Shikatani, Kawasaki, both of Japan

[73] Assignee: Fujitsu Limited, Kawasaki, Japan

[21] Appl. No.: 347,320

[22] Filed: May 4, 1989

[30] Foreign Application Priority Data

May 20, 1988 [JP] Japan .................................. 63-124113

[51] Int. Cl.$^5$ ............................................. G11C 11/40
[52] U.S. Cl. ................................... 365/230.05; 365/63
[58] Field of Search .................... 365/230.05, 154, 155, 365/156, 190, 202, 63, 51

[56] References Cited

U.S. PATENT DOCUMENTS

| | | | |
|---|---|---|---|
| 3,893,087 | 7/1975 | Baker | 365/51 |
| 4,866,677 | 9/1989 | Sakurai | 365/230.05 |
| 4,873,672 | 10/1989 | Etoh et al. | 365/203 |

*Primary Examiner*—Joseph A. Popek
*Attorney, Agent, or Firm*—Armstrong, Nikaido, Marmelstein, Kubovcik & Murray

[57] ABSTRACT

A partial random access memory includes a plurality of memory cells arrayed in matrix form, a plurality of pairs of bit lines extending in a column direction, each of the plurality of memory cells being coupled to corresponding one of pairs of bit lines, and a plurality of word lines including a plurality of first and second word lines. One first word line and one second word line are paired and arranged on both sides of an arrangement of the memory cells in a row direction. Each of the plurality of memory cells is connected to at least one of the first and second word lines. An activating circuit coupled to the plurality of word lines separately activates the first and second word lines, depending on an address signal supplied from an external circuit, thereby independently selecting the first and second word lines. An input/output circuit coupled to the plurality of bit lines writes input data into corresponding memory cells and reads out output data from corresponding memory cells.

20 Claims, 9 Drawing Sheets

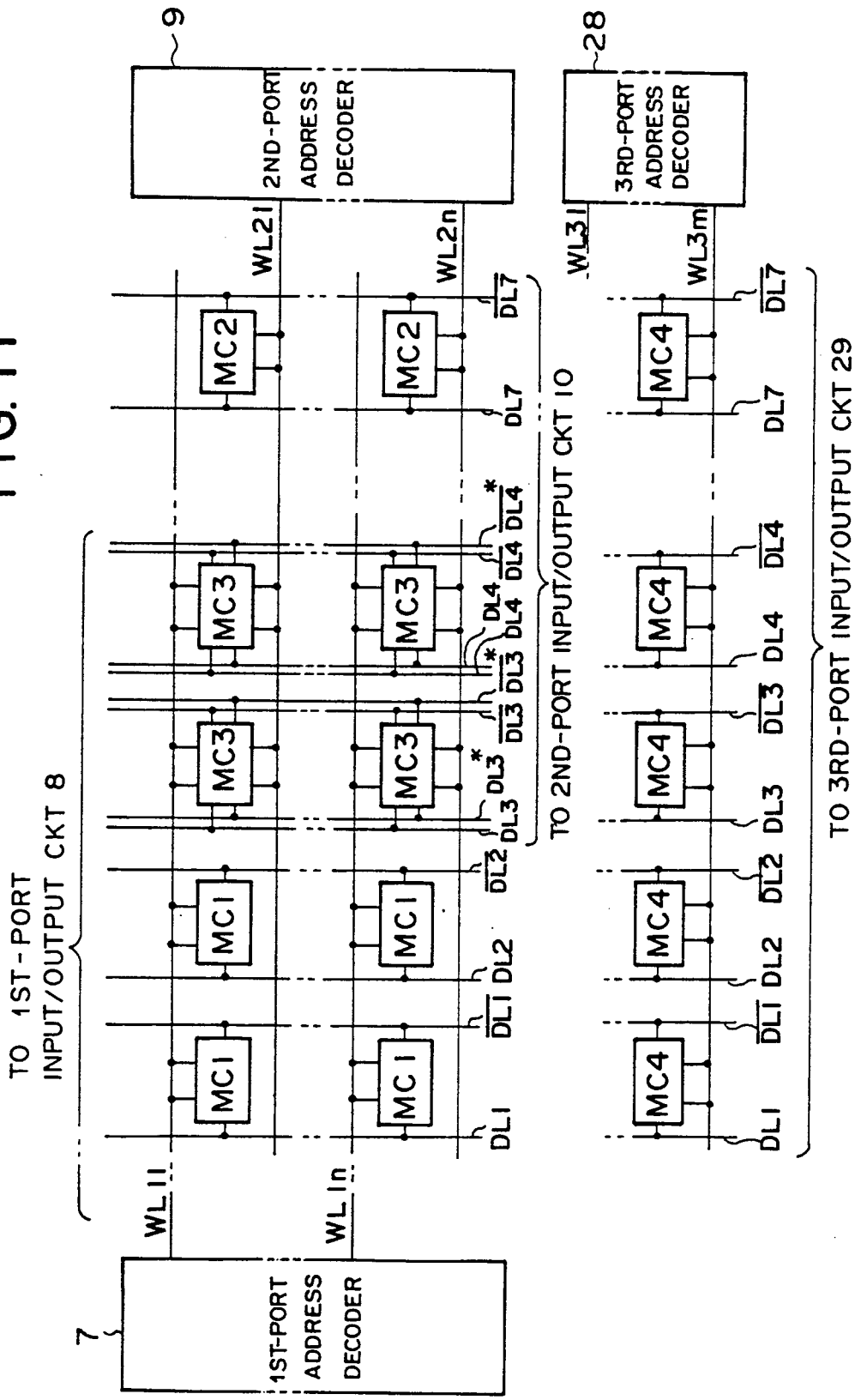

PARTIAL RANDOM ACCESS MEMORY

BACKGROUND OF THE INVENTION

The present invention generally relates to a static random access memory, and particularly to a partial random access memory in which a partial write is available with high flexibility.

Currently, a random access memory (hereafter simply referred to as a RAM) is widely used from the following reasons. First, a data write and read can arbitrarily be carried out. Secondly, the degree of freedom to use RAMs is high. Thirdly, there is no need for a refresh operation, while a need exists for a refresh operation in a dynamic random access memory. Recently, there is a great demand for custom integrated circuits called application specific integrated circuits (ASICs), which are fabricated so as to conform to specific applications. Therefore, a further increased degree of freedom to use RAMs is required.

A conventional RAM has a plurality of memory cells arranged in matrix form so as to construct a memory cell array. Each of the memory cells stores data amounting to one bit. In operation, word lines arranged in the Y direction of the memory cell array are selected by a decoded address signal obtained by an address decoder provided in the RAM, which decodes an address signal supplied from an external circuit such as a central processing unit. In this state, bit lines arranged in the X direction of the memory cell array are selected by a data signal consisting of a predetermined number of bits, which is supplied from the external circuit. Thereby, data can be written into or read out from the RAM. The read/write operation in conventional RAMs is carried out for a predetermined number of bits such as 8, 16, 32 and 64 bits.

Currently, in an application, there is a need for partially writing a predetermined number of data bits (high-order bits, low-order bits, or intermediate bits) in addition to the function of writing of all the bits of input data at one time. For example, such a need exists for a floating-point computation, in which the exponent and mantissa parts of two binary numbers to be computed are separately processed. In another application, it is required to rewrite only 36 high-order or low-order bits of data consisting of 72 bits. A write such as the above-mentioned writing operations is referred to as a partial write.

It is noted that conventionally, in order to achieve the partial write, a plurality of write control systems must be provided in a RAM. For example, in the above-mentioned case, a write control system must be provided for each of the 32 high-order bits and 32 low-order bits. It is additionally noted that generally, the partial write function of conventional RAMs is not flexible. For example, 32 intermediate bits of the 64-bit input data cannot be processed in the conventional partial write, when the partial write function is designed to process the 32 high-order bits and 32 low-order bits.

Currently, in RAMs as custom ICs, there is a variety of needs for the bit width of input data, bit width and position of data to be processed in the partial write, all depending on users, demand. Further, a boundary is not always fixed at which bits to be partially written and bits to be maintained as they are, are separated. In the above-mentioned cases, it is very difficult to effectively achieve the partial write simply by using a plurality of write control systems. In other words, the degree of freedom to use RAMs is low.

SUMMARY OF THE INVENTION

It is therefore a general object of the present invention to provide a novel and useful partial random access memory in which the disadvantages are eliminated.

A more specific object of the present invention is to provide a partial random access memory in which an arbitrary number of bits can be accessed.

The above objects of the present invention can be achieved by a partial random access memory comprising a plurality of memory cells arrayed in matrix form, a plurality of pairs of bit lines extending in a column direction, each of the plurality of memory cells being coupled to corresponding one of pairs of bit lines, and a plurality of word lines including a plurality of first and second word lines. One first word line and one second word line are paired and arranged on both sides of an arrangement of the memory cells in a row direction. Each of the plurality of memory cells is connected to at least one of the first and second word lines. An activating circuit coupled to the plurality of word lines separately activates the first and second word lines, depending on an address signal supplied from an external circuit, thereby independently selecting the first and second word lines. An input/output circuit coupled to the plurality of bit lines writes input data into corresponding memory cells and reads out output data from corresponding memory cells.

The other objects, features and advantages of the present invention will become apparent from the following detailed description when read in conjunction with the accompanying drawings.

BRIEF DESCRIPTION OF THE DRAWINGS

FIG. 11 a block diagram of an essential part of a third preferred embodiment of the present invention.

DETAILED DESCRIPTION

Figure 1:
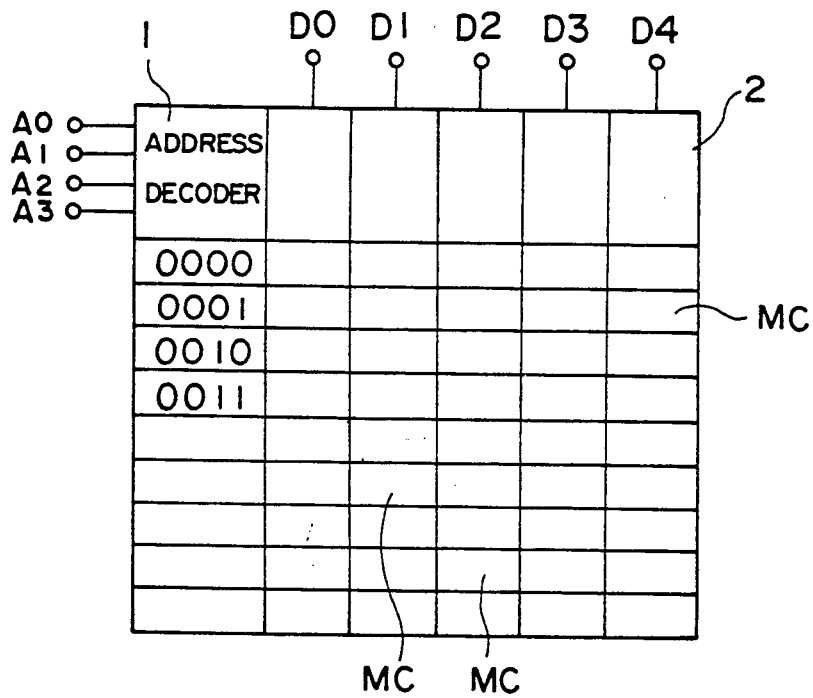
FIG. 1 is a schematic view of a conventional RAM of the master slice type.
Figure 2:
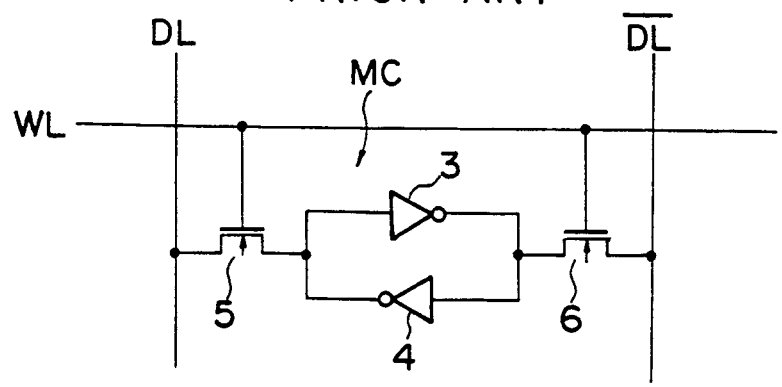
FIG. 2 is a circuit diagram of a memory cell in the conventional RAM of FIG. 1.

A description is given of a conventional RAM with reference to FIGS. 1 and 2, in order to facilitate the understanding of the present invention.

Referring to FIG. 1, an illustrated RAM has a storage capacity amounting to 9 words×5 bits. An address signal consisting of 4 bits is supplied to an address decoder 1 through address terminals A0 through A3. The address decoder 1 decodes the supplied address signal and generates corresponding one of decoded addresses "0000"-"1000". Thereby, one word line corresponding to the supplied address signal is selected from among the 9 word lines. Then input data is supplied to data terminals D0 through D4, and is written in memory cells MC related to the selected word line through an input/output circuit 2.

As is illustrated in FIG. 2, each of the memory cells MC is a flip-flop type memory cell, which is constructed by two inverters 3 and 4 each including a complementary metal oxide semiconductor (CMOS) inverter. Each of the memory cells MC is coupled to a pair of related bit lines DL and $\overline{DL}$ through N-channel transfer gates (MOS transistors) 5 and 6, respectively. The gates of the MOS transistors 5 and 6 are connected to a related word line WL.

When the address signal is supplied to the address decoder 1, a related word line WL (the word line WL shown in FIG. 2, for example) is activated, or switched to a high (H) level. Thereby, the transfer gates 5 and 6 are made open and the corresponding memory cell MC is allowed to be accessed through the pair of bit lines DL and $\overline{DL}$. In this state, a data signal is supplied to the bit lines DL and $\overline{DL}$, and thereby data (0 or 1) amounting to one bit can be written into the memory cell MC. It is noted that when a word line is activated, all the memory cells becomes connected thereto, whereby data can be written into or read out from the related memory cells.

However, the illustrated RAM has the aforementioned disadvantages. The present invention intends to overcome the disadvantages of conventional RAMs.

Figure 3:
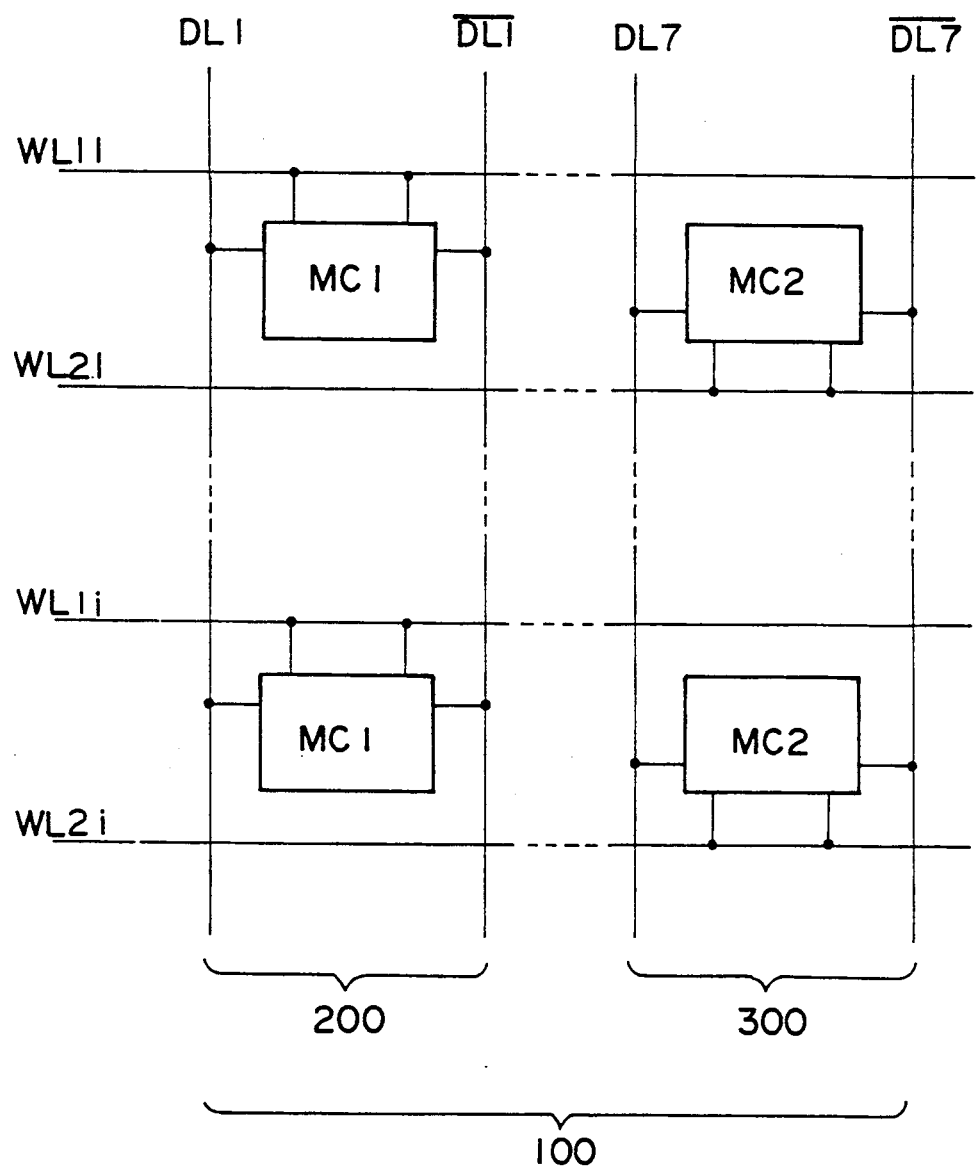
FIG. 3 is a view illustrating a conception of the present invention.

A description is given of a conception of the present invention with reference to FIG. 3. A memory cell array 100 includes a first memory cell array 200 and a second memory cell array 300. The first memory cell array 200 includes a plurality of first memory cells MC1, which are coupled to first word lines WL1i (i = 1, 2, ...). Only two word lines WL11 and WL1i are shown in FIG. 3 for convenience sake. The second memory cell array 300 includes a plurality of second memory cells MC2, which are coupled to second word lines WL2i (i = 1, 2, ...). Only two word lines WL21 and WL2i are shown in FIG. 3 for convenience's sake. The first word lines WL1i and second word lines WL2i can separately be activated. The first memory cells MC1 are coupled to a pair of bit lines DL1 and DL1. The second memory cells MC2 are coupled to a pair of bit lines DL7 and DL7. Actually, a plurality of first memory cell arrays 200 and second memory cell arrays 300 are arranged on a semiconductor chip.

The first memory cell array 200, or the first memory cells MCI can be accessed by selecting the first word lines WL1i. The second memory cell array 300, or the second memory cells MC2 can be accessed by selecting the second word lines WL2i. Since each of the memory cells arranged in one line is coupled to one of the word lines which can be separately activated, a flexible partial access (write and read) can be achieved.

Figure 4:
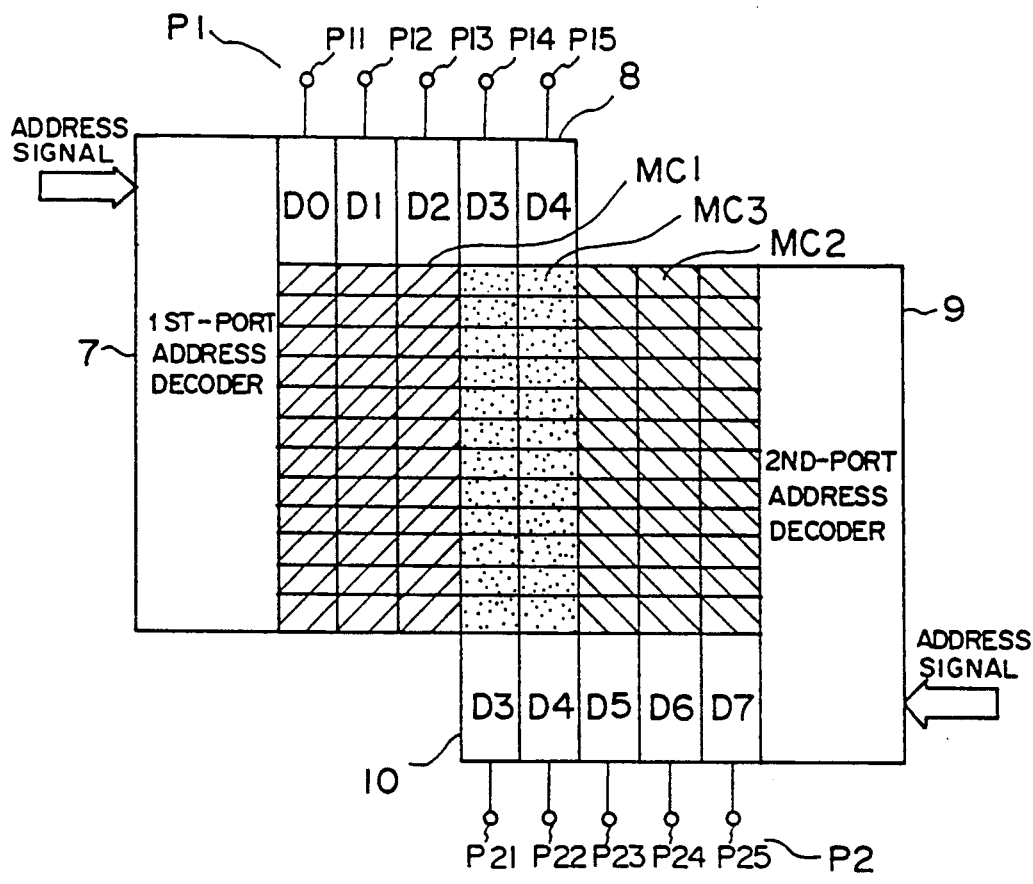
FIG. 4 is a schematic view of a first preferred embodiment of the invention.

A description is given of a first preferable embodiment of the present invention. Referring to FIG. 4, there is illustrated a dual-port type RAM of the first preferable embodiment of the present invention. The illustrated RAM has a first port P1 including five terminals P11 through P15, and a second port P2 including five terminals P21 through P25.

An array of memory cells in the embodiment includes three areas. A first area relates to a first memory cell array, which includes first memory cells MC1. A second area relates to a second memory cell array, which includes second memory cells MC2. A third area relates to a third memory cell array, which includes third memory cells MC3. Input data consists of 8 bits, D0 through D7. Five bits D0 through D4 among the 8-bit input data D0 through D7 are written into or read out from the RAM through the first port P1 and pairs of bit lines or data lines such as DL1 and DL1 (FIG. 3). Five bits D3 through D7 among the input data D0 through D7 are written into or read out from the RAM through the second port P2 and pairs of bit lines such as DL7 and DL7 (FIG. 3). It is noted that input data D3 and D4 are written into or read out from the RAM through both the first and second ports P1 and P2.

When accessing the RAM, an address signal is supplied to a first-port address decoder 7, which activates a corresponding word line. With the word line activated, input data D0 through D4 are supplied to the RAM through the first port P1 and a first-port input/output circuit 8. Thereby, it is possible to write the input data D0 through D4 in the first and third memory cells MCI and MC3 associated with the activated (selected) word line. With a timing different from the above, an address signal is supplied to a second-port address decoder 9, which activates a corresponding word line. With the word line activated, input data D3 through D7 are supplied to the RAM through the second port P2 and a second-port input/output circuit 10. Thereby, it is possible to write the input data D3 through D7 in the third and second memory cells MC3 and MC2 associated with the activated word line. In this manner, the above-mentioned partial write can be carried out selectively for a specific area of the RAM.

Figure 5:
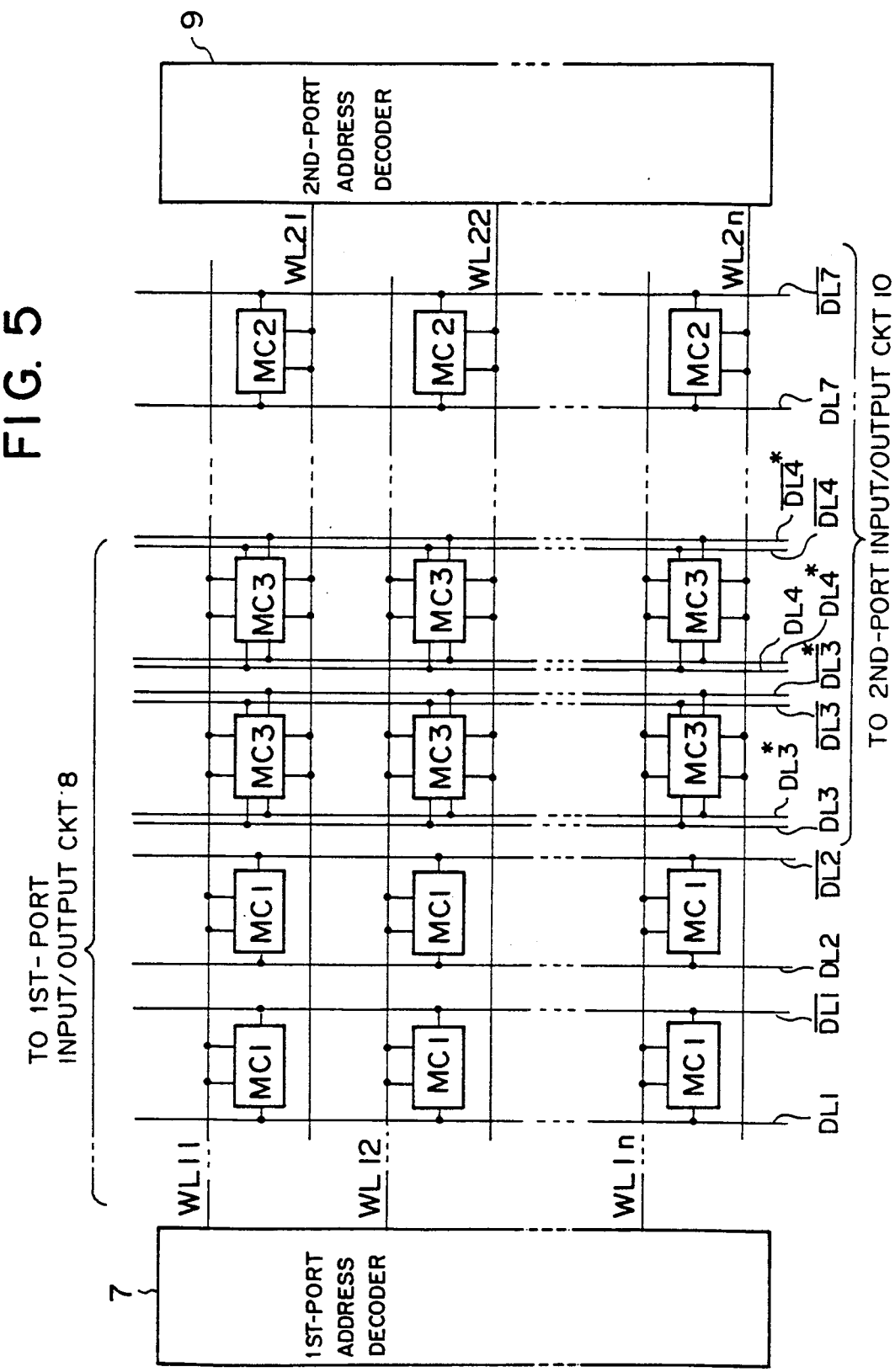
FIG. 5 is a block diagram of the detailed structure of the first preferred embodiment shown in FIG. 4.

The detailed structure of the RAM of FIG. 3 is illustrated in FIG. 5, in which those parts which are the same as those in FIG. 4 are given the same reference numerals. Referring to FIG. 5, first word lines WL11, WL12, ..., WL1n (WL1i; i=1, 2, ..., n) extend from the first-port address decoder 7. The first and third memory cells MC1 and MC3 are connected to the first word lines WL1i. Second word lines WL21, WL22, ..., WL2n (WL2i; i=1, 2, ..., n) extend from the second-port address decoder 9. The second and third memory cells MC2 and MC3 are connected to the second word lines WL2i. Pairs of bit lines DL0, DL0; DL1, DL1; DL2, DL2; DL3, DL3; and DL4, DL4 extend from the first-port input/output circuit 8 (FIG. 4). Pairs of bit lines DL3*, DL3*; DL4*, DL4*; DL5 DL6, DL6; and DL7, DL7 extend from the second-port input/output circuit 10 (FIG. 4). The data D3 is written into or read out from the corresponding third memory cell MC3 through either the pair of bit lines DL3 and DL3 or the pair of bit lines DL3* and DL3*. Similarly, the data D4 is written into or read out from the corresponding third memory cell MC3 through either the pair of bit lines DL4 and DL4 or the pair of bit lines DL4 and DL4*.

Figure 6:
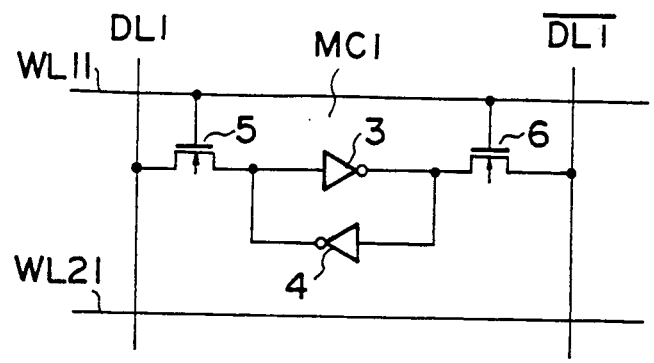
FIG. 6 is a circuit diagram of a first memory cell used in the embodiment of FIG. 4.

FIG. 6 is a circuit diagram of the first memory cell MC1 connected to the pair of bit lines DL1 and DL1 and the first word line WL11 arranged in the first row. As is illustrated, the first memory cell MC1 includes two CMOS inverters 3, 4, and two transfer gates 5, 6 each formed by an N-channel MOS transistor. The gates of the MOS transistors 5 and 6 are connected to the first word line WL11. The flip-flop constructed by the CMOS inverters 3 and 4 is connected to the bit lines DL1 and DL1 through the transfer gates 5 and 6, respectively. With the above-mentioned structure, it is possible to carry out the partial write for the illustrated first memory cell MC1 by selecting the first word line WL11. In other words, the first memory cell MC1 is not activated even when the second word line WL21 is activated. The structure of FIG. 6 can be applied to each of the other first memory cells MC1 connected only to the first word lines WL1i.

Figure 7:
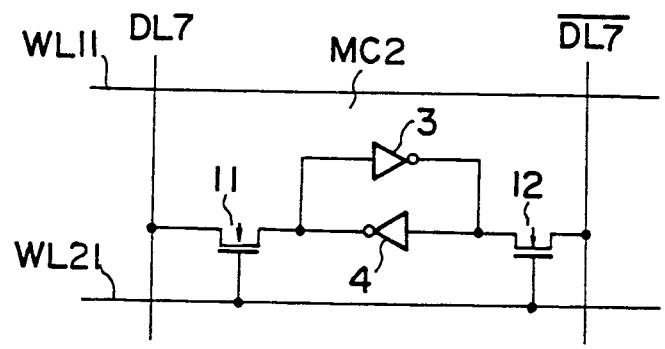
FIG. 7 is a circuit diagram of a second memory cell used in the embodiment of FIG. 4.

FIG. 7 is a circuit diagram of the second memory cell MC2 connected to the pair of bit lines DL7 and DL7 and the second word line WL21 arranged in the first row. As is illustrated, the second memory cell MC2 includes two CMOS inverters 3, 4, and two transfer gates 11, 12 each formed by an N-channel MOS transistor. The gates of the MOS transistors 11 and 12 are connected to the second word line WL21. The flip-flop constructed by the CMOS inverters 3 and 4 is connected to the bit lines DL7 and DL7 through the transfer gates 11 and 12, respectively. With the above-mentioned structure, it is possible to carry out the partial write for the illustrated second memory cell MC2 by selecting the second word line WL21. In other words, the second memory cell MC2 is not activated even when the first word line WL11 is activated. Each of the other second memory cells MC2 connected only to the second word lines WL2i is constructed in the same way as the second memory cell MC2 of FIG. 7.

Figure 8:
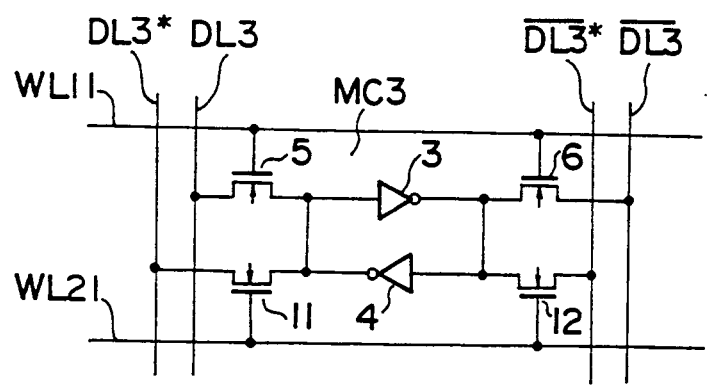
FIG. 8 is a circuit diagram of a third memory cell used in the embodiment of FIG. 4.

FIG. 8 is a circuit diagram of the third memory cell MC3 connected to the two pairs of bit lines DL3, DL3, and DL3*, DL3* and the word lines WL11 and WL21. As is illustrated, the third memory cell MC3 includes two CMOS inverters 3 and 4, and four transfer gates 5, 6, 11 and 12 each formed by an N-channel MOS transistor. The gates of the MOS transistors 5 and 6 are connected to the first word line WL11, and the gates of the MOS transistors 11 and 12 are connected to the second word line WL21. The flip-flop configured by the CMOS inverters 3 and 4 is connected to the bit lines DL3 and DL3 through the transfer gates 5 and 6, respectively, and to the bit lines DL3* and DL3* through the transfer gates 11 and 12, respectively. With the above-mentioned structure, it is possible to carry out the partial write for the third memory cell MC3 by selecting either the first word line WL11 or the second word line WL21. Each of the other third memory cells MC3 connected to both the second and third word lines WL2i, WL3i is constructed in the same way as the third memory cell MC3 of FIG. 8.

Figure 9A:
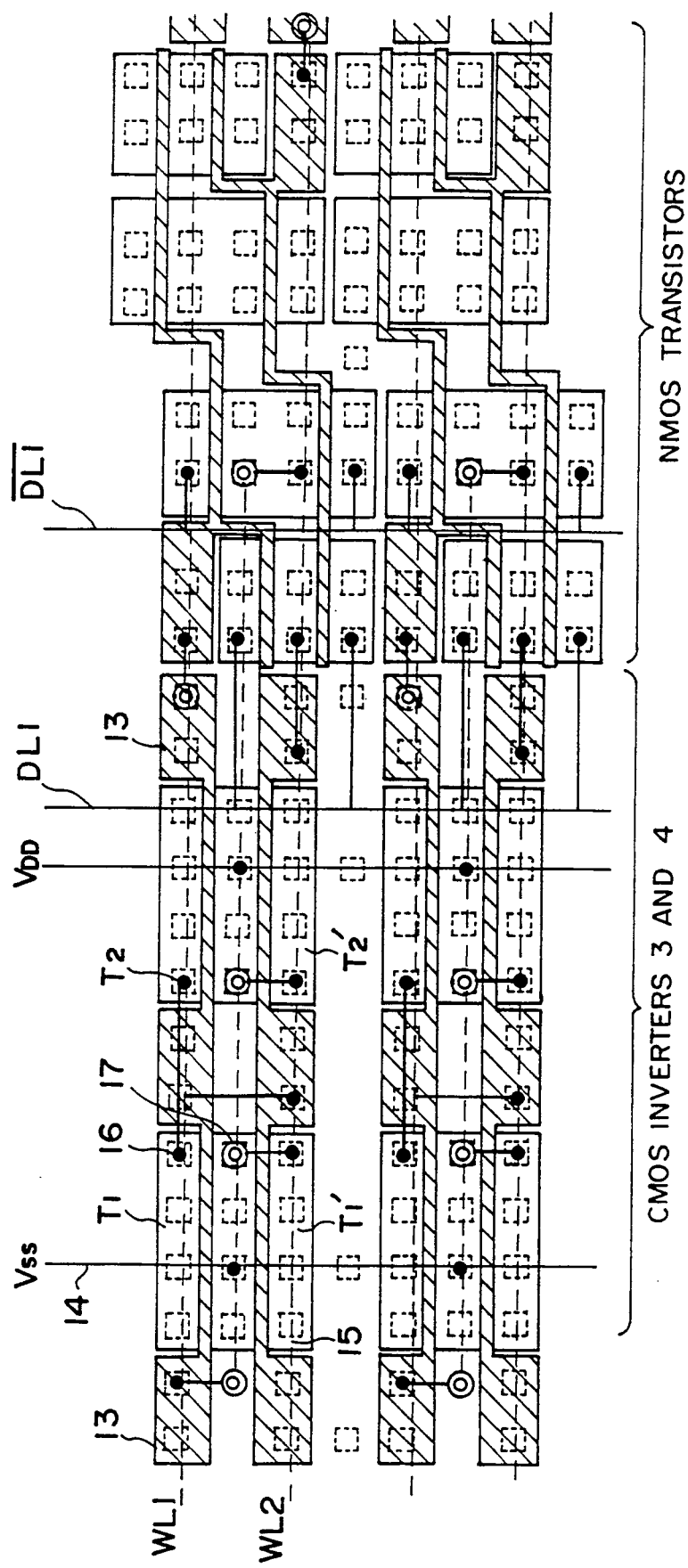
FIG. 9A is a view illustrating an example of the layout of the embodiment of FIG. 4.
Figure 9B:
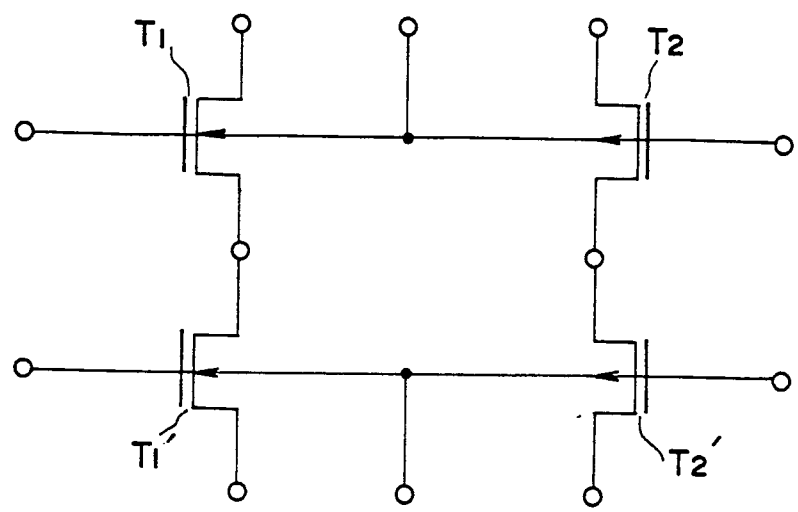
FIG. 9B is a circuit diagram of a flip-flop made up of two CMOS inverters formed by a portion of the layout shown in FIG. 9A.
Figure 9C:
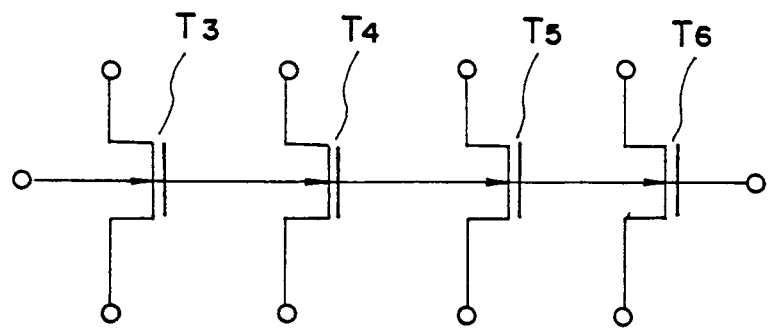
FIG. 9C is a circuit diagram of transfer gates each formed by an N-channel MOS transistor constructed by a portion of the layout shown in FIG. 9A.

FIG. 9A illustrates a part of the layout formed when the aforementioned partial RAM is constructed by basic cells of a gate array (master slice type). For the sake of simplicity, a part of the layout relating to some of the first memory cells MC1 is shown. The second and third memory cells MC2 and MC3 may be formed in a similar way to the first memory cells MC1. Referring to FIG. 9A, there are provided two N-channel MOS transistors (hereafter simply referred to as NMOS transistors) T1 and T1', and P-channel MOS transistors (hereafter simply referred to as PMOS transistors) T2 and T2' in this order from the left-hand side of the drawing. The NMOS transistors T1, T1', and PMOS transistors T2, T2' construct the aforementioned CMOS inverters 3 and 4, which are mutually connected to form the first memory cell MC1 of flip-flop. The illustrated layout portion relating to the NMOS transistors T1 and T1' and the PMOS transistors T2 and T2' constructs a circuit shown in FIG. 9B. Further, on the right-hand side of the first memory cell MC1, there are disposed four NMOS transistors T3 through T6, which are served as transfer gates such as the transfer gates 5 and 6 shown in FIG. 6. For example, the NMOS transistors T3 and T4 correspond to the transfer gates 5 and 6 shown in FIG. 6. The illustrated layout portion relating to the NMOS transistors T3 through T7 constructs a circuit shown in FIG. 9C. A hatched area indicated by a reference numeral 13 is a gate made of polysilicon. A solid line indicated by a reference numeral 14 is a first metallization layer such as an aluminum layer. Positive and negative power source voltages $V_{DD}$ and $V_{SS}$ are supplied to the memory cells through the related first metallization layers 14. A broken line indicated by a reference numeral 15 is a second metallization layer, which are provided on an insulating layer formed on the first metallization layer 14. A black dot indicated by a reference numeral 16 is a contact between the first metallization layer 14 and a transistor region (source or drain region). A double circle indicated by a reference numeral 17 is a contact used for connecting a first metallization layer 14 and a second metallization layers 15.

In operation, when only five bits D0 through D4 out of the 8-bit input data D0 through D7 are written into the corresponding memory cells, one first word line WL1i is activated by the address signal supplied to the first-port address decoder 7. It is now assumed that the first word line WL11 in the first row is selected. Then, the transfer gates 5 and 6 of the first and third memory cells MC1 and MC3 connected to the first word line WL11 are turned ON. Then the input data D0 through D4 are written in the corresponding first and third memory cells MC1 and MC3 related to the first word line WL11. During the above-mentioned operation, no address signal is supplied to the second-port address decoder 9. Thus, the contents of the second memory cells MC2 connected to the second word line WL21 in the first row are maintained as they are. In this manner, the partial write with respect to the input data D0 through D4 is carried out.

On the other hand, when the partial write is carried out with respect to five bits D3 through D7 out of the 8-bit input data D0 through D7, one second word line WL2i is activated by the address signal supplied to the second-port address decoder 9. It is now assumed that the second word line WL21 in the first row is activated. Then the transfer gates 11 and 12 connected to the second word line WL21 are turned ON. Then the input data D3 through D7 are written in the corresponding second and third memory cells MC2 and MC3 related to the second word line WL21. During the above-mentioned operation, no address signal is supplied to the first-port address decoder 7. Thus, the contents of the first memory cells MC1 connected to the first word line WL11 in the first row are maintained as they are.

Figure 10:
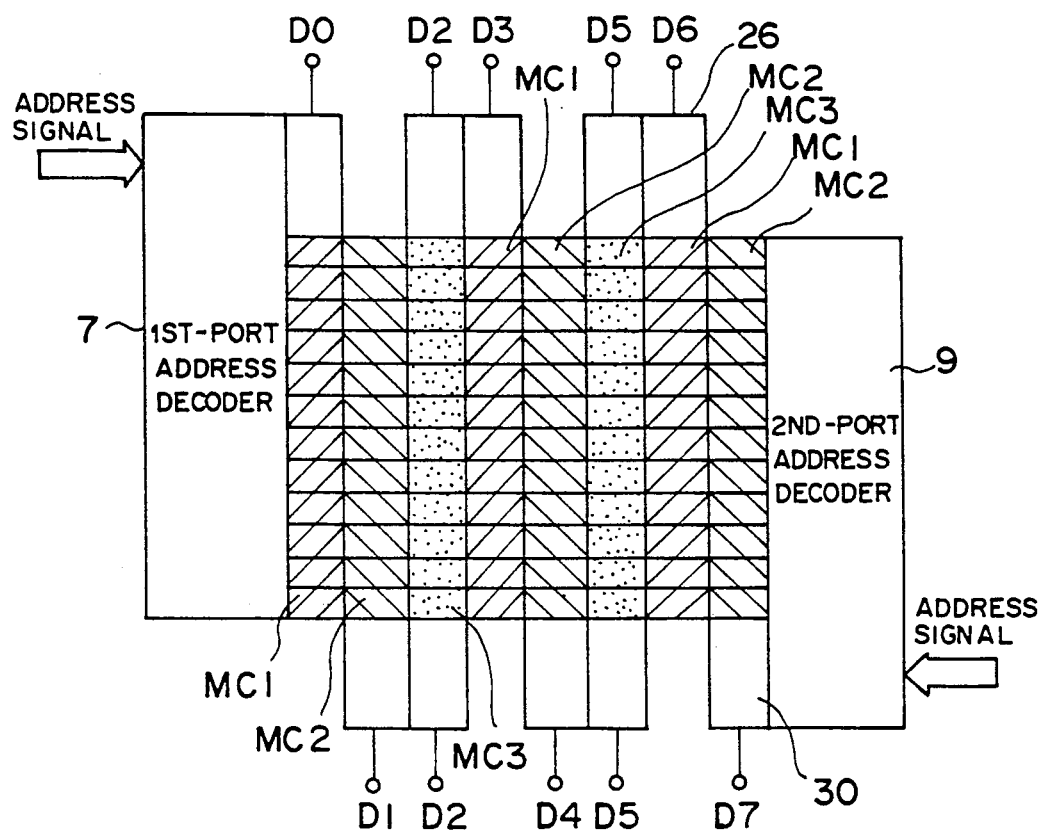
FIG. 10 is a schematic view of a second preferred embodiment of the present invention.

FIG. 10 illustrates the structure of a second preferred embodiment of the present invention. The second preferred embodiment corresponds to a variation of the arrangement pattern of the first to third memory cells MC1 to MC3. Referring to FIG. 10, the first, second and third memory cells MC1, MC2 and MC3 are repetitively arranged one by one in this order. Input data D0, D3 and D6 can be written into the first memory cells MC1 connected only to the first word lines WL1i through a first-port input/output circuit 26. Input data D1, D4 and D7 can be written into the second memory cells MC2 connected only to the second word lines WL2i through a second-port input/output circuit 30. Input data D2 and D5 can be written into the third memory cells MC3 connected to both the first and second word lines WL1i and WL2i.

FIG. 11 illustrates a third preferred embodiment of the present invention. A plurality of fourth memory cells MC4 are provided in the third embodiment. It is noted that the fourth memory cells are provided for all the bits D0 through D7. In other words, one row consists of only the fourth memory cells MC4. The fourth memory cells MC4 are connected to third word lines WL3i (i=1, 2, ..., m), which extend from a third-port address decoder 28. The third-port address decoder 28 selects one of the third word lines WL3i, depending on an address signal supplied thereto. Further, the fourth memory cells MC4 are coupled to the data lines D0 through D7 and D0 through D7, which extend from a third-port input/output circuit 29 (not shown for convenience, sake). The third embodiment can provide the function of partially writing input data and the function of writing all the input data at the same time. Each of the fourth memory cells MC4 may be constructed in the same way as the second memory cell MC2 illustrated in FIG. 7.

The fourth memory cells MC4 and the third-port address decoder 28 may be applied to the second embodiment shown in FIG. 10. In a similar manner to the above-mentioned manner, it is possible to construct a variety of RAMs. For example, it is possible to construct a RAM having four or more input/output ports.

The present invention is not limited to the aforementioned embodiments, and variation and modifications may be made without departing from the scope of the present invention.

What is claimed is:

1. A partial random access memory comprising:
   a plurality of memory cells arrayed in matrix form;
   a plurality of pairs of bit lines extending in a column direction, each of said plurality of memory cells being coupled to corresponding one of said pairs of bit lines, memory cells in one row respectively connected to different pairs of bit lines;
   a plurality of word lines including a plurality of first and second word lines, one first word line and one second word line being paired in one row and arranged in a row direction, each of said plurality of memory cells in each row being connected to at least one of said first and second word lines;
   activating means, coupled to said plurality of word lines, for separately activating said first and second word lines, depending on an address signal supplied from an external circuit, therein independently selecting said first and second word lines and selectively activating only those memory cells in one row which are connected to the selected word line; and
   input/output means, coupled to said plurality of bit lines, for writing input data into corresponding memory cells and reading out output data from corresponding memory cells.

2. A partial random access memory as claimed in claim 1, wherein some of said memory cells arranged in one row are connected to corresponding one of said first word lines, and the remaining memory cells arranged in the same row are connected to corresponding one of said second word lines.

3. A partial random access memory as claimed in claim 1, wherein said plurality of memory cells include a plurality of first memory cells and a plurality of second memory cells, and wherein said first memory cells are connected to the corresponding first word lines, and said second memory cells are connected to the corresponding second word lines.

4. A partial random access memory as claimed in claim 3, wherein said plurality of memory cells include a plurality of third memory cells, which are connected to both the paired first and second word lines.

5. A partial random access memory as claimed in claim 1, wherein each of said input and output data includes first data bits and second data bits, and said pairs of bit lines comprises pairs of first bit lines and pairs of second bit lines, and wherein said input/output means comprises,
   first input/output means for writing said first input data bits through said pairs of first bit lines into said memory cells connected to said first word lines and for reading out said first data bits therefrom, and
   second input/output means for writing said second data bits through said pairs of second bit lines into said memory cells connected to second word lines and for reading out said second data bits therefrom.

6. A partial random access memory as claimed in claim 5, wherein said plurality of memory cells include a plurality of third memory cells, each of which is connected to both the paired first and second word lines and to both the pair of first bit lines and the pair of second bit lines.

7. A partial random access memory as claimed in claim 6, wherein each of said third memory cells comprises flip-flop means, connected to said activating means, for storing data amounting to one bit, first transfer gate means for selectively connecting said flip-flop means to corresponding one pair of first bit lines, and second transfer gate means, connected to said activating means, for selectively connecting said flip-flop means to corresponding one pair of second bit lines.

8. A partial random access memory as claimed in claim 7, wherein the pair of first bit lines and the pair of second bit lines with respect to said third memory cells transfer the same data bit.

9. A partial random access memory as claimed 7, wherein said flip-flop means comprises two complementary metal oxide semiconductor transistors, and each of said first and second transfer gate means comprises two N-channel metal oxide semiconductor transistor.

10. A partial random access memory as claimed in claim 5, wherein said first input/output means comprises a first port through which said first data bits to be input or output pass, and said second input/output means comprises a second port through with said second data bits to be input or output pass.

11. A partial random access memory as claimed in claim 1, wherein said activating means comprises first address decoding means for decoding said address signal to activate said first word lines, and second address decoding means for decoding said address signal to activate said second word lines with a timing different from a timing for said first address decoding means.

12. A partial random access memory as claimed in claim 1, wherein said plurality of memory cells include a plurality of first memory cells, a plurality of second memory cells, and a plurality of third memory cells, wherein said first memory cells are connected to the corresponding first word lines, and said second memory cells are connected to the corresponding second word lines, and wherein said third memory cells are connected to both the corresponding first and second word lines, and said arrangement of memory cells in one row includes said first, second and third memory cells.

13. A partial random access memory as claimed in claim 12, wherein in one row, said first memory cells are successively arranged, said second memory cells are successively arranged, and said third memory cells are successively arranged.

14. A partial random access memory as claimed in claim 12, wherein said first, second and third memory cells are repetitively arranged in this order one by one in one row.

15. A partial random access memory as claimed in claim 1, wherein said plurality of word lines include a plurality of third word lines extending from said activating means, and each of said third word lines is activated separately from said first and second word lines by said activating means, and wherein said plurality of memory cells include memory cells connected to said third word lines, said memory cells connected to one of said word lines amount to said input or output data.

16. A partial random access memory as claimed in claim 15, wherein said activating means comprises means for activating said third word lines separately from said first and second word lines.

17. A partial random access memory as claimed in claim 1, wherein each of said memory cells comprises flip-flop means for storing data amounting to one bit, and transfer gate means, connected to said activating means, for selectively connecting said flip-flop means to corresponding one pair of bit lines.

18. A partial random access memory as claimed in claim 1, wherein said partial random access memory is a static random access memory.

19. A partial random access memory as claimed in claim 1, wherein said partial random access memory is of the master slice type.

20. A partial random access memory comprising:
a plurality of memory cells arrayed in matrix form, said plurality of memory cells include a plurality of first memory cells, a plurality of second memory cells, and a plurality of third memory cells;
a plurality of pairs of bit lines extending in a column direction, each of said plurality of memory cells being coupled to corresponding one of said pairs of bit lines;
a plurality of word lines including a plurality of first and second word lines, one first word line and one second word line being paired in one row and arranged in a row direction, each of said plurality of memory cells in each row being connected to at least one of said first and second word lines, said first memory cells are connected to the corresponding first word lines, said second memory cells are connected to the corresponding second word lines and said third memory cells connected to both the paired first and second word lines;
activating means, coupled to said plurality of word lines, for separately activating said first and second word lines, depending on an address signal supplied from an external circuit, therein independently selecting said first and second word lines and selectively activating only those memory cells in one row which are connected to the selected word line; and
input/output means, coupled to said plurality of bit lines, for writing input data into corresponding memory cells and reading out output data from corresponding memory cells.

* * * * *